United States Patent
Vermeulen et al.

(10) Patent No.: US 11,156,924 B2
(45) Date of Patent: Oct. 26, 2021

(54) SUBSTRATE SUPPORT, LITHOGRAPHIC APPARATUS, SUBSTRATE INSPECTION APPARATUS, DEVICE MANUFACTURING METHOD

(71) Applicant: ASML Netherlands B.V., Veldhoven (NL)

(72) Inventors: Johannes Petrus Martinus Bernardus Vermeulen, Leende (NL); Luc Leonardus Adrianus Martinus Meulendijks, Helmond (NL); Antonius Franciscus Johannes De Groot, Lierop (NL); Johannes Adrianus Cornelis Maria Pijnenburg, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/269,909

(22) PCT Filed: Jul. 16, 2019

(86) PCT No.: PCT/EP2019/069153
§ 371 (c)(1),
(2) Date: Feb. 19, 2021

(87) PCT Pub. No.: WO2020/038661
PCT Pub. Date: Feb. 27, 2020

(65) Prior Publication Data
US 2021/0263431 A1 Aug. 26, 2021

(30) Foreign Application Priority Data

Aug. 23, 2018 (EP) ..................... 18190585

(51) Int. Cl.
*G03F 7/20* (2006.01)

(52) U.S. Cl.
CPC ...... *G03F 7/70725* (2013.01); *G03F 7/70775* (2013.01)

(58) Field of Classification Search
CPC .. G03F 7/70783; G03F 7/707; G03F 7/70716; G03F 7/70775
See application file for complete search history.

(56) References Cited

U.S. PATENT DOCUMENTS 6,020,964 A 2/2000 Loopstra et al.
6,952,253 B2 10/2005 Lof et al.
(Continued)

FOREIGN PATENT DOCUMENTS

JP H07-115054 A 5/1995
TW 2011-42543 A 12/2011
(Continued)

OTHER PUBLICATIONS

International Search Report and Written Opinion of the International Searching Authority directed to related International Patent Application No. PCT/EP2019/069153, dated Oct. 23, 2019; 11 pages.

*Primary Examiner* — Steven Whitesell Gordon
(74) *Attorney, Agent, or Firm* — Sterne, Kessler, Goldstein & Fox P.L.L.C.

(57) ABSTRACT

The invention provides a substrate support for supporting a substrate, comprising:
a support body, which support body comprises a support surface for supporting the substrate,
a rotary dither device, which is configured to induce a relative rotary dither motion between the substrate and the support surface of the support body around a rotation axis which is perpendicular to the support surface.

15 Claims, 11 Drawing Sheets

(56) References Cited

U.S. PATENT DOCUMENTS

| | | |
|---|---|---|
| 7,662,302 B2 | 2/2010 | Elyaakoubi et al. |
| 9,606,456 B2 | 3/2017 | Ogura et al. |
| 9,696,638 B2 | 7/2017 | Van Der Pasch et al. |
| 10,139,735 B2 | 11/2018 | Baselmans et al. |
| 2004/0182311 A1* | 9/2004 | Hanazaki .......... H01L 21/67288 118/663 |
| 2006/0102289 A1* | 5/2006 | Fukatsu ............ H01L 21/67259 156/345.55 |
| 2007/0058173 A1 | 3/2007 | Holzapfel |
| 2007/0182947 A1 | 8/2007 | Hempenius et al. |
| 2013/0033691 A1* | 2/2013 | Soethoudt ........... G03F 7/70783 355/72 |
| 2016/0154322 A1 | 6/2016 | Huang et al. |
| 2017/0261862 A1 | 9/2017 | Chu et al. |
| 2017/0261864 A1 | 9/2017 | Nakiboglu et al. |
| 2019/0113853 A1* | 4/2019 | Onvlee ................... G03F 7/707 |

FOREIGN PATENT DOCUMENTS

| | | |
|---|---|---|
| TW | 2015-44914 A | 12/2015 |
| TW | 2016-02735 A | 1/2016 |
| TW | 2016-33014 A | 9/2016 |
| WO | WO 2011/131390 A1 | 10/2011 |
| WO | WO 2014/063874 A1 | 5/2014 |
| WO | WO 2017/182216 A1 | 10/2017 |

\* cited by examiner

SUBSTRATE SUPPORT, LITHOGRAPHIC APPARATUS, SUBSTRATE INSPECTION APPARATUS, DEVICE MANUFACTURING METHOD

CROSS-REFERENCE TO RELATED APPLICATION

This application claims priority of EP application 18190585.2 which was filed on Aug. 23, 2018 and which is incorporated herein in its entirety by reference.

FIELD

The present invention relates to a substrate support, a lithographic apparatus, a substrate inspection apparatus and a device manufacturing method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). A substrate inspection apparatus is suitable for inspecting the pattern which has been applied to the substrate.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In known lithographic processes, several layers of resist are applied on a substrate. A pattern is projected onto a layer of resist, then a subsequent layer of resist is applied and a subsequent pattern is projected onto this subsequent layer of resist. This cycle is repeated multiple times before the processing of the substrate is finished. It is essential that subsequent patterns are projected at correct relative positions. If a subsequent pattern is shifted too far relative to a previous pattern, electrical connections in a microchip that is made from the substrate may fail.

A known source of such an undesired shift in position of a subsequent pattern is deformation of the substrate. The loading of the substrate onto the substrate support contributes to the substrate deformation. For example, the friction between the substrate and the surface which supports the substrate during the process of arranging the substrate onto the substrate support is a relevant factor in this. The effects of this friction on the deformation of the substrate are hard to predict.

It is known that a relative dither motion between two bodies reduces the friction between these bodies when these two bodies are brought into contact with each other. In WO2017/182216 this principle is applied to the arranging of a substrate on a substrate support of a lithographic apparatus. In the system of WO2017/182216, the dither motion is a translation movement of the substrate in the plane of the substrate.

SUMMARY

The invention aims to provide a substrate support in which deformation of the substrate when a substrate is loaded onto the substrate support is reduced.

According to an embodiment of the invention, a substrate support is provided which comprises:
- a support body, which support body comprises a support surface for supporting the substrate,
- a rotary dither device, which is configured to induce a relative rotary dither motion between the substrate and the support surface of the support body around a rotation axis which is perpendicular to the support surface.

In accordance with the current invention, it has been found that a rotary dither motion around a rotation axis which extends perpendicular to the support surface of the substrate support is effective in reducing the undesired friction between the substrate and the support surface of the substrate support when the substrate is loaded onto said support surface. In particular, deformation of the substrate in radial direction due to the friction between the substrate and the support surface during the arrangement of the substrate on the support surface is reduced. This is the direction in which often the deformation of the substrate due to friction during loading is the largest.

In the relative rotary dither motion between the substrate and the support surface of the support body, the substrate may dither in a rotational direction while the support surface of the support body is stationary, or the support surface of the support body may dither in a rotational direction while the substrate is stationary, or both the substrate and the support surface of the support body may dither relative to each other, e.g. dither in opposite directions.

In an embodiment of the substrate support according to the invention, the rotary dither device is configured to induce the relative rotary dither motion between the substrate and the support surface of the support body when the substrate is in contact with at least a part of the support surface of the support body.

The rotary dither motion is effective when it is applied when the substrate is in contact with at least a part of the support surface of the support body, because this is when the friction between the substrate and the support surface of the support body of the substrate support occurs.

In an embodiment of the substrate support according to the invention, the support body comprises a plurality of support body burls, and the top surfaces of the support body burls together form the support surface.

Friction between support body burls and the substrate, in particular in radial direction of the substrate, is a cause of substrate deformation. By applying the rotary dither motion according to the invention, the friction between the support body burls and the substrate in radial direction is reduced, resulting in less deformation of the substrate when the substrate is loaded onto the support body of the substrate support.

In an embodiment of the substrate support according to the invention, the rotary dither device is configured to induce the relative rotary dither motion between the substrate and the support surface of the support body when the substrate is in contact with at least a part of the support surface of the support body. Furthermore, in this embodiment, the support body comprises a plurality of support body burls, and the top surfaces of the support body burls together form the support surface. Furthermore, in this embodiment, the rotary dither device is configured to induce the relative rotary dither motion between the substrate and the support surface of the support body when the substrate is in contact with at least a support body burl.

In an embodiment of the substrate support according to the invention, the substrate support further comprises a support body holder, and the support body is arranged on the support body holder, and the rotary dither device is configured to induce a relative rotary dither motion between the substrate and a combination of the support body and the support body holder.

In the relative rotary dither motion between the substrate and the combination of the support body and the support body holder, the substrate may dither in a rotational direction while the combination of the support body and the support body holder is stationary, or the combination of the support body and the support body holder may dither in a rotational direction while the substrate is stationary, or both the substrate and combination of the support body and the support body holder may dither relative to each other, e.g. dither in opposite directions.

An advantage of this embodiment is that the mass that has to be dithered is relatively small.

In an embodiment of the substrate support according to the invention, the substrate support further comprises a support body positioner having a short-stroke module, and the rotary dither device is configured to induce a relative rotary dither motion between the substrate and a combination of the support body and the short-stroke module.

In the relative rotary dither motion between the substrate and the combination of the support body and the short-stroke module, the substrate may dither in a rotational direction while the combination of the support body and the short-stroke module is stationary, or the combination of the support body and the short-stroke module may dither in a rotational direction while the substrate is stationary, or both the substrate and combination of the support body and the short-stroke module may dither relative to each other, e.g. dither in opposite directions.

An advantage of this embodiment is that the mass that has to be dithered is relatively small.

In an embodiment of the substrate support according to the invention, the substrate support further comprises a support body positioner having a short-stroke module, and the rotary dither device is configured to induce a relative rotary dither motion between the substrate and a combination of the support body and short-stroke module. Furthermore, in this embodiment, the support body comprises a plurality of table support burls which are configured to support the substrate table on the short-stroke module, which table support burls are spaced apart from each other, and the rotary dither device comprises an actuator which is arranged in a space between adjacent table support burls. The table support burls are for example located on a surface of the support body which is opposite to the support surface for supporting the substrate.

In an embodiment of the substrate support according to the invention, the substrate support further comprises a support body positioner having a short-stroke module and a long-stroke module, the support body being arranged on the short-stroke module, and the rotary dither device is configured to induce a relative rotary dither motion between the short-stroke module and long-stroke module.

In an embodiment of the substrate support according to the invention, the substrate support further comprises a support body positioner having a short-stroke module and a long-stroke module, the support body being arranged on the short-stroke module, and the rotary dither device is configured to induce a relative rotary dither motion between the substrate and a combination of the support body, the short-stroke module and the long-stroke module.

In an embodiment of the substrate support according to the invention, the substrate support further comprises a support body positioner having a short-stroke module and a long-stroke module, the support body being arranged on the short-stroke module, and the rotary dither device is configured to induce a relative rotary dither motion between the short-stroke module and long-stroke module. Furthermore, in this embodiment, the support body positioner comprises an actuator which is configured to induce relative motion between the short-stroke module and the long-stroke module, and the rotary dither device comprises an actuator controller which is configured to control the actuator of the support body positioner to induce the rotary dither motion between the short-stroke module and long-stroke module.

In an embodiment of the substrate support according to the invention, the substrate support further comprises a substrate positioner, which is configured to arrange the substrate on the support surface of the support body.

In an embodiment of the substrate support according to the invention, the substrate support further comprises a substrate positioner, which is configured to arrange the substrate on the support surface of the support body. Furthermore, in this embodiment, the rotary dither device is configured to induce a relative rotary dither motion between the substrate positioner and substrate support surface.

In the relative rotary dither motion between the substrate positioner and the support surface of the support body, the substrate positioner may dither in a rotational direction while the support surface of the support body is stationary, or the support surface of the support body may dither in a rotational direction while the substrate positioner is stationary, or both the substrate positioner and the support surface of the support body may dither relative to each other, e.g. dither in opposite directions.

In an embodiment of the substrate support according to the invention, the substrate support further comprises a substrate positioner, which is configured to arrange the substrate on the support surface of the support body. Furthermore, in this embodiment, the rotary dither device is configured to induce a relative rotary dither motion between the substrate positioner and the substrate support surface. Furthermore, in this embodiment, the substrate positioner comprises a loading pin, and the rotary dither device is configured to induce a relative rotary dither motion between the loading pin and the substrate support surface.

In the relative rotary dither motion between the loading pin and the support surface of the support body, the loading pin may dither in a rotational direction while the support surface of the support body is stationary, or the support surface of the support body may dither in a rotational direction while the loading pin is stationary, or both the loading pin and the support surface of the support body may dither relative to each other, e.g. dither in opposite directions.

According to an embodiment of the invention, a substrate support is provided which comprises:
- a support body, which support body comprises a support surface for supporting the substrate,
- a substrate positioner, which is configured to arrange the substrate on the support surface of the support body,
- a rotary dither device, which is configured to induce a relative rotary dither motion between the substrate positioner and the substrate support surface.

This embodiment can be combined with all other embodiments of the invention.

In an embodiment of the substrate support according to the invention, the support surface extends in a support surface plane, and the rotary dither device is configured to induce a relative rotary dither motion between the substrate and the support surface of the support body in a plane which is parallel to the support surface plane.

In an embodiment of the substrate support according to the invention, the substrate support further comprises a substrate positioner, which is configured to arrange the substrate on the support surface of the support body. Furthermore, in this embodiment, the substrate positioner is configured to hold the substrate in a substrate plane while arranging the substrate on the support surface of the support body, and the rotary dither device is configured to induce a relative rotary dither motion between the substrate and the support surface of the support body in a plane which is parallel or at least substantially parallel to the substrate plane.

In a further embodiment of the invention, a lithographic apparatus is provided which comprises a substrate support according to the invention.

In an embodiment of the lithographic apparatus according to the invention, the lithographic apparatus comprises a projection system and a substrate positioning system for positioning a substrate relative to the projection system, and the substrate positioning system comprises a substrate support according to the invention.

In an embodiment of the lithographic apparatus according to the invention, the lithographic apparatus comprises a substrate pre-alignment device, and the substrate pre-alignment device comprises a substrate support according to the invention.

In an embodiment of the lithographic apparatus according to the invention, the lithographic apparatus comprises a substrate thermal stabilization device which is configured to stabilize a temperature of the substrate, and the substrate thermal stabilization device comprises a substrate support according to the invention.

In a further embodiment of the invention, a substrate inspection apparatus is provided which comprises a substrate support according to the invention.

In a further embodiment of the invention, device manufacturing method is provided which comprises transferring a pattern from a patterning device onto a substrate, comprising the step of using a lithographic apparatus according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
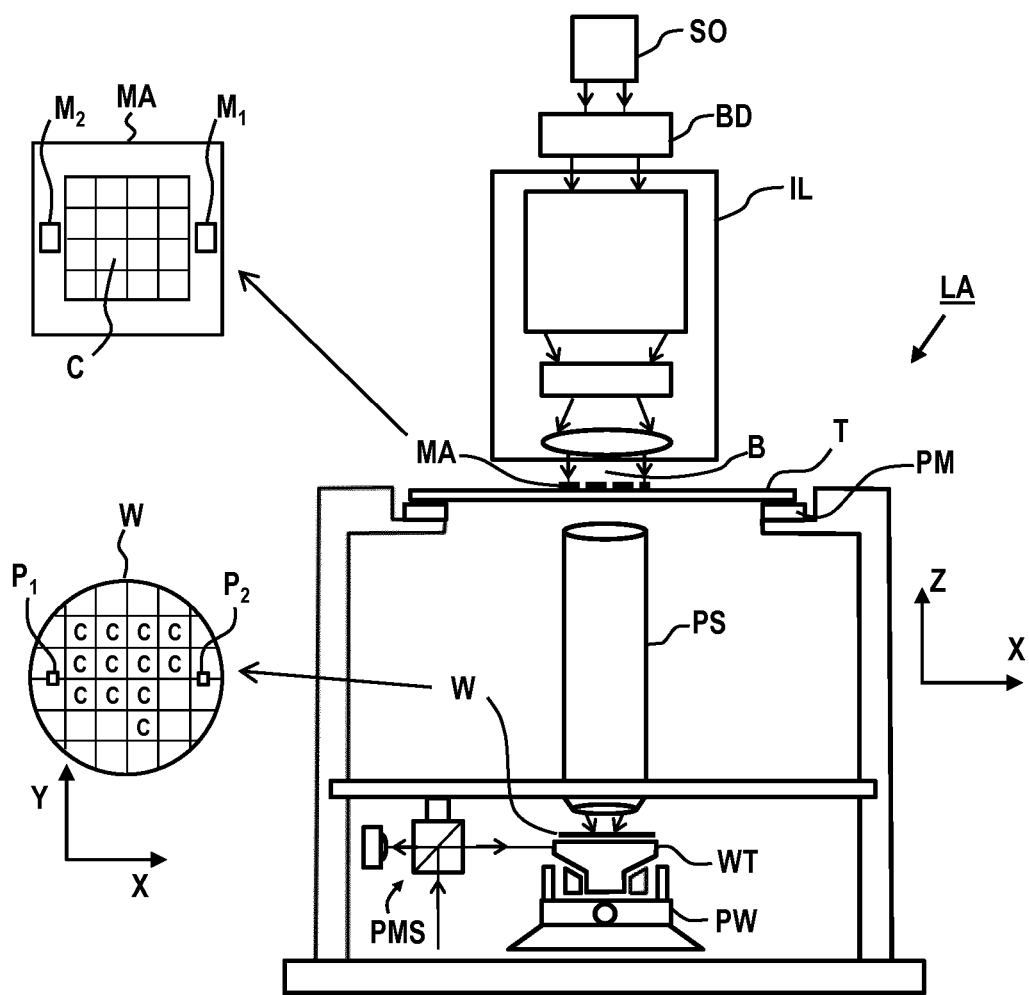
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a support body (e.g., a wafer table) WT constructed to hold a substrate (e.g., a resist coated wafer) W and connected to a second positioner PW configured to accurately position the support body WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more support bodies WT (also named "dual stage"). In such "multiple stage" machine, the support bodies WT may be used in parallel, and/or steps in preparation of a subsequent exposure of the substrate W may be carried out on the substrate W located on one of the support body WT while another substrate W on the other support body WT is being used for exposing a pattern on the other substrate W.

In addition to the support body WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the support body WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the support body WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
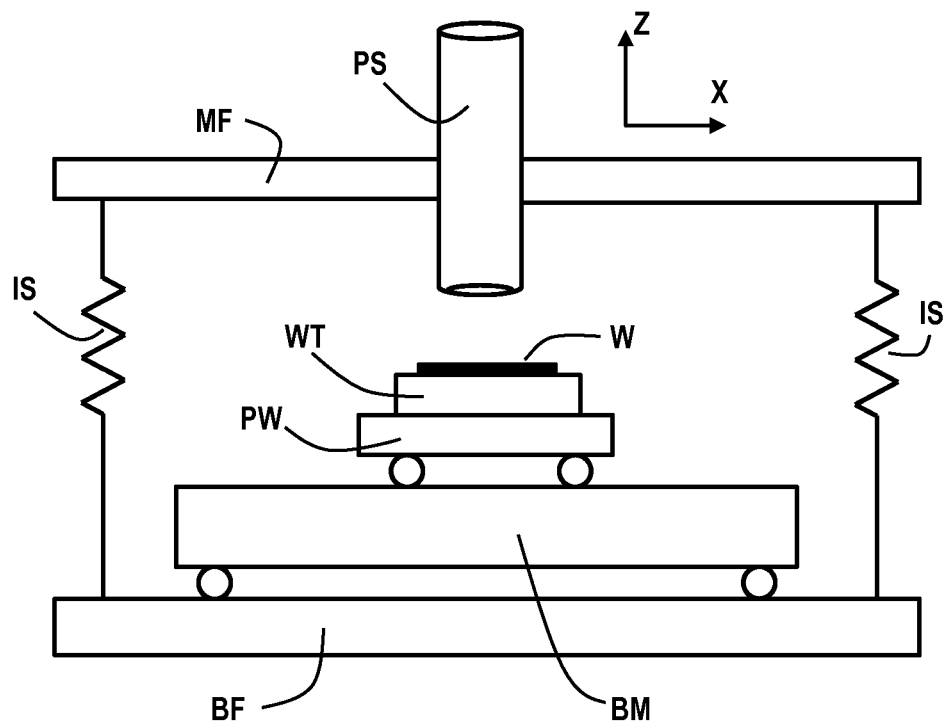
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the support body WT by providing a driving force between the support body WT and the balance mass BM. The driving force accelerates the support body WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the support body WT.

In an embodiment, the second positioner PW is supported by the balance mass BM. For example, wherein the second positioner PW comprises a planar motor to levitate the support body WT above the balance mass BM. In another embodiment, the second positioner PW is supported by the base frame BF. For example, wherein the second positioner PW comprises a linear motor and wherein the second positioner PW comprises a bearing, like a gas bearing, to levitate the support body WT above the base frame BF.

The position measurement system PMS may comprise any type of sensor that is suitable to determine a position of the support body WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam.

Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, +1st order, −1st order, +2nd order and −2nd order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the support body WT. In another example, a grating is arranged on a bottom surface of the support body WT, and an encoder head is arranged below the support body WT.

The position measurement system PMS may comprise an interferometer system. An interferometer system is known from, for example, United States patent U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the support body WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the support body WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the support body WT relative to the projection system PS with a high accuracy over a large range of movement. The short-stroke module is arranged to move the support body WT relative to the long-stroke module, and the long-stroke module is arranged to move the short-stroke module. The short-stroke module may move the support body WT in a direction in a first movement range. The long-stroke module may move the short-stroke module in the direction in a second movement range larger than the first movement range.

The first positioner PM and the second positioner PW each are provided with an actuator to move respectively the mask support MT and the support body WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the support body WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the support body WT respectively to the mask support MT. The actuator may be a moving-coil type actuator which has the at least one coil coupled to the support body WT respectively to the mask support MT. The actuator may be a voice-coil actuator, a reluctance actuator, a Lorentz-actuator or a piezo-actuator, or any other suitable actuator.

Figure 3:
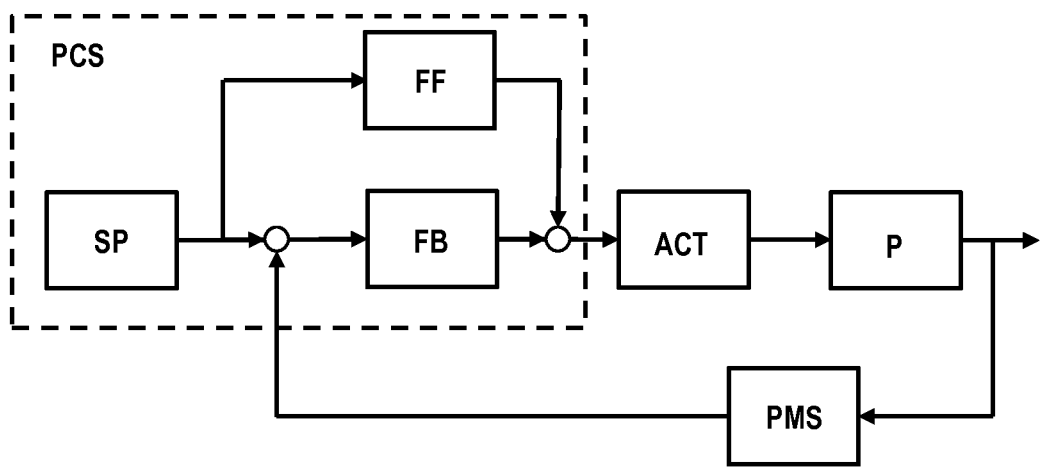
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the support body WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the support body WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

FIGS. 4-7 show an example of a method of loading a substrate W onto a substrate support 1.

In the example of FIGS. 4-7, the substrate support 1 comprises a support body WT, which is for example a substrate table or wafer table. The substrate body WT is provided with a plurality of support body burls 12. The top surfaces of these support body burls 12 together form a support surface 11 for supporting the substrate W. The support surface 11 extends in the x-y-plane.

In the example of FIGS. 4-7, the substrate support 1 further comprises support body positioner 15 (which is or comprises for example second positioner PW) having a short-stroke module 20 and a long-stroke module 30. The substrate support body WT is arranged onto the short-stroke module 20 of the support body positioner 15 and moves along with it. The short-stroke module 20 is mounted on the long-stroke module 30. Short-stroke actuators 21, which are for example linear motors, move the short-stroke module 20 with the support body WT relative to the long-stroke module 30.

The long-stroke module 30 is moved by a long-stroke actuator 31, which is for example a planar motor. The long-stroke actuator 31 moves the long-stroke module 30 for example relative to the base frame BF of a lithographic apparatus or a base frame of a substrate inspection apparatus.

In the example of FIGS. 4-7, the substrate support 1 further comprises a substrate positioner 34 which comprises a plurality of loading pins 33. For example, three loading pins 33 are provided. The loading pins 33 are moveable in the z-direction, so perpendicular to the support surface 11. In the x-y plane, the loading pins 33 for example move along with and/or are coupled to the long-stroke module 30. The long-stroke module 30 is provided with bores 32 through which the loading pins 33 extend. The short-stroke module 20 is provided with bores 22 through which the loading pins 33 extend. The support body WT is provided with bores 13 through which the loading pins 33 extend.

A lithographic apparatus or substrate inspection apparatus in which a substrate support 1 according to the invention may be used, often further comprises a substrate gripper 2, for bringing the substrate W to the substrate support 1.

Figure 4:
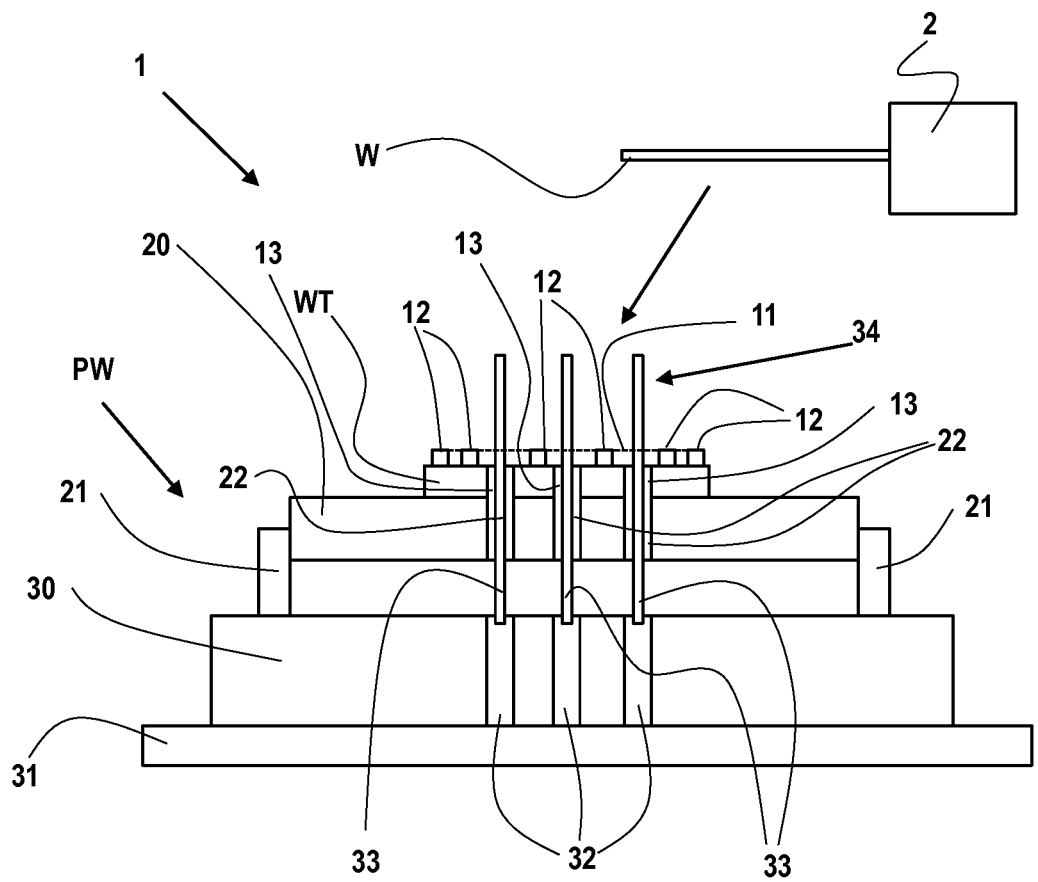
FIG. 4 schematically shows a step in an example of a method of loading a substrate W onto a substrate support, FIG. 5 schematically shows a subsequent step in an example of a method of loading a substrate W onto a substrate support, FIG. 6 schematically shows a subsequent step in an example of a method of loading a substrate W onto a substrate support, FIG. 7 schematically shows a subsequent step in an example of a method of loading a substrate W onto a substrate support, FIG. 8 schematically shows a first embodiment of a substrate support 1 according to the invention FIG. 9 schematically shows a second embodiment of a substrate support 1 according to the invention, FIG. 10 schematically shows a third embodiment of a substrate support 1 according to the invention, FIG. 11 schematically shows an embodiment in which a lithographic apparatus or substrate inspection apparatus comprises a substrate gripper which is configured to arrange a substrate W on a substrate support.

In the substrate loading method of FIGS. 4-7, initially the loading pins 33 of the substrate positioner 34 are in their uppermost position. In this position, the loading pins 33 extend above the support surface 11 of the support body WT. The substrate gripper 2 holds the substrate W and brings the substrate W to the upper ends of the loading pins 33. This is shown in FIG. 4.

Figure 5:
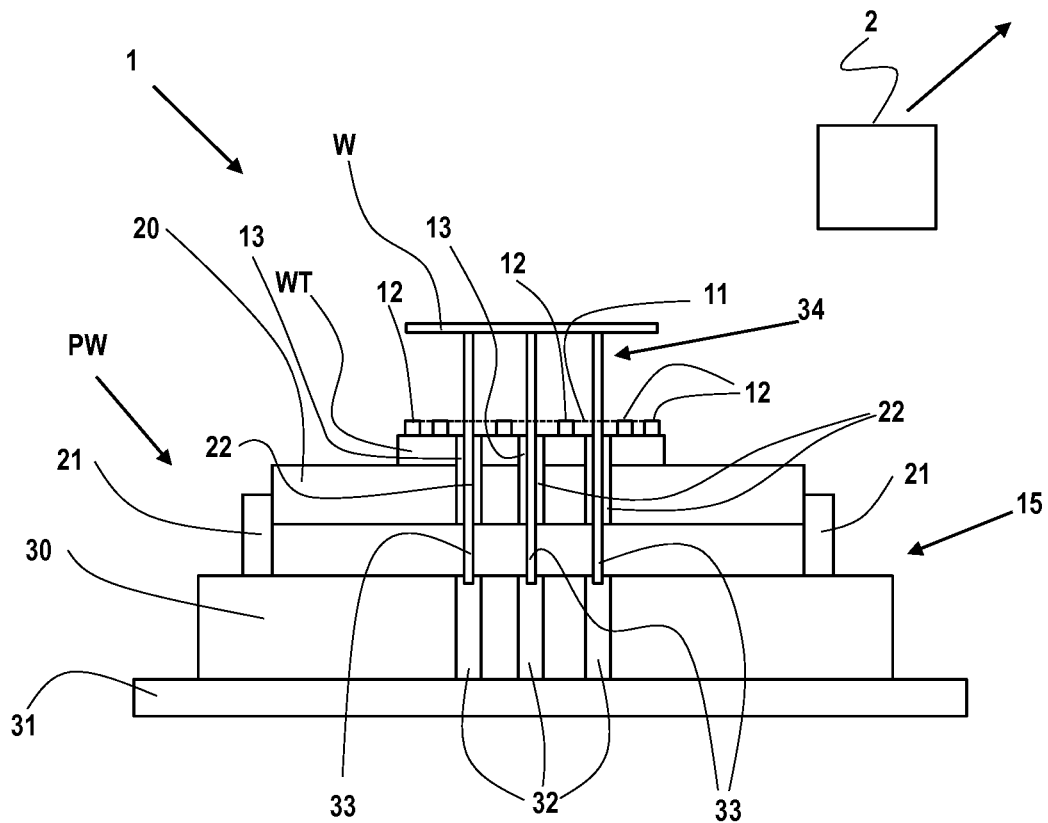

FIG. 5 shows a subsequent stage in the exemplary substrate loading method. The substrate gripper 2 has arranged the substrate W on top of the loading pins 33. The substrate gripper 2 has released the substrate W and moves away from the substrate support 1. The substrate W rests upon the loading pins 33. In this position, the substrate W extends in the x-y plane, so parallel or at least substantially parallel to the support surface 11.

Figure 6:
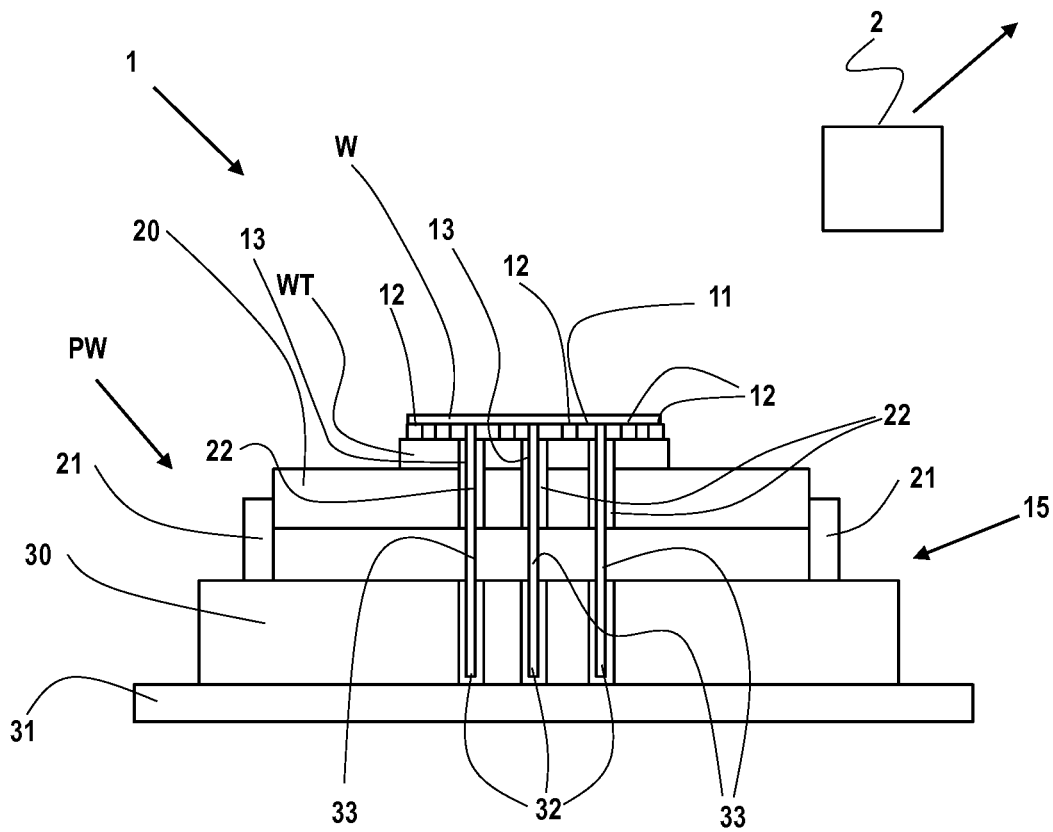

FIG. 6 shows a further subsequent stage in the exemplary substrate loading method. The loading pins 33 are moved downwards in the z-direction to bring the substrate W into contact with the support surface 11 of the support body WT, which support surface 11 is in this embodiment formed by the tops of the support body burls 12. This is when the substrate W comes into contact when the support surface 11 of the support body WT, and friction between the support surface 11 and the substrate W starts to occur. So, in this part of the substrate loading method, it is advantageous to apply the relative rotary dither motion according to the invention.

Figure 7:
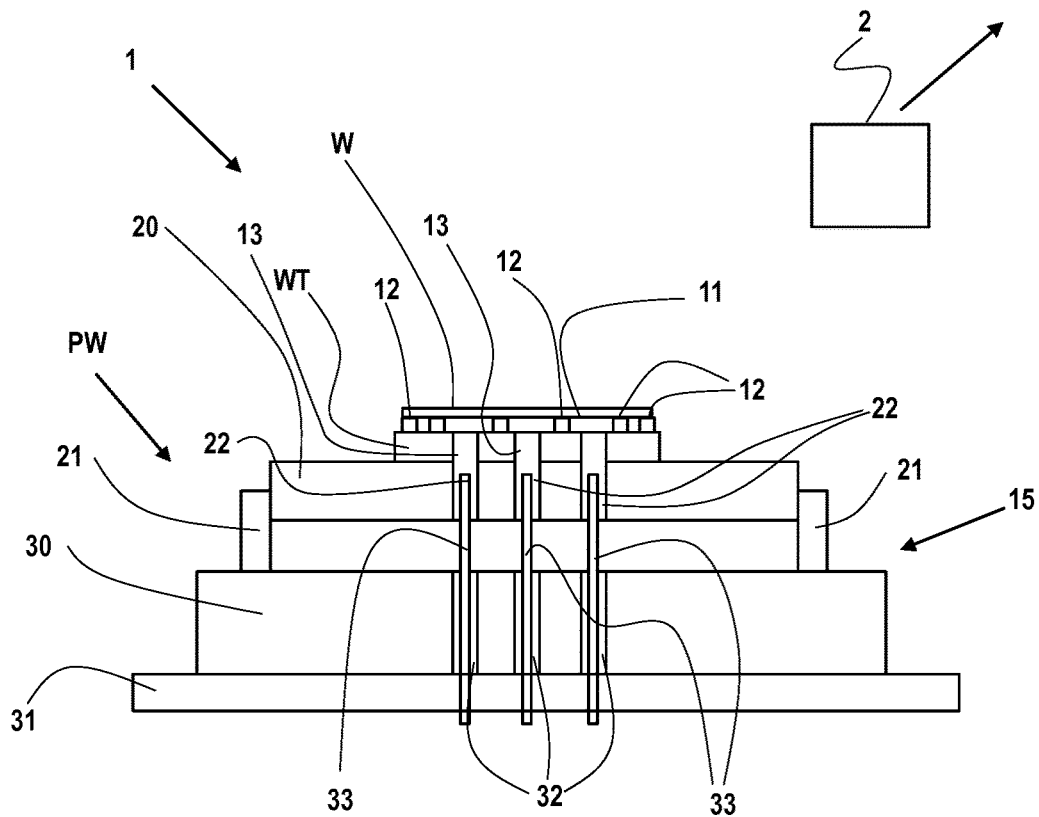

FIG. 7 shows a further subsequent stage in the exemplary substrate loading method. The loading pins 33 are moved further downwards in the z-direction and therewith release the substrate W. The substrate W now rests upon the support surface 1 of the support body WT. A clamp, such as a vacuum clamp or an electrostatic clamp, may be applied to fix the substrate W onto the support surface 11 of the support body WT. The clamp may optionally already provide a clamping force before the loading pins 33 are moved downwards from the position as seen in FIG. 6. Due to the clamping forces, the substrate W may locally move over the top of one or more support body burls 12, therewith causing further deformation of the substrate W. This is in particular the case when the clamping force is not only used to fix the substrate W into position on the support surface 11, but also to flatten a substrate which is somewhat warped when it arrives at the substrate support 1. So, also in this part of the substrate loading method, it is advantageous to apply the relative rotary dither motion according to the invention.

Figure 8:
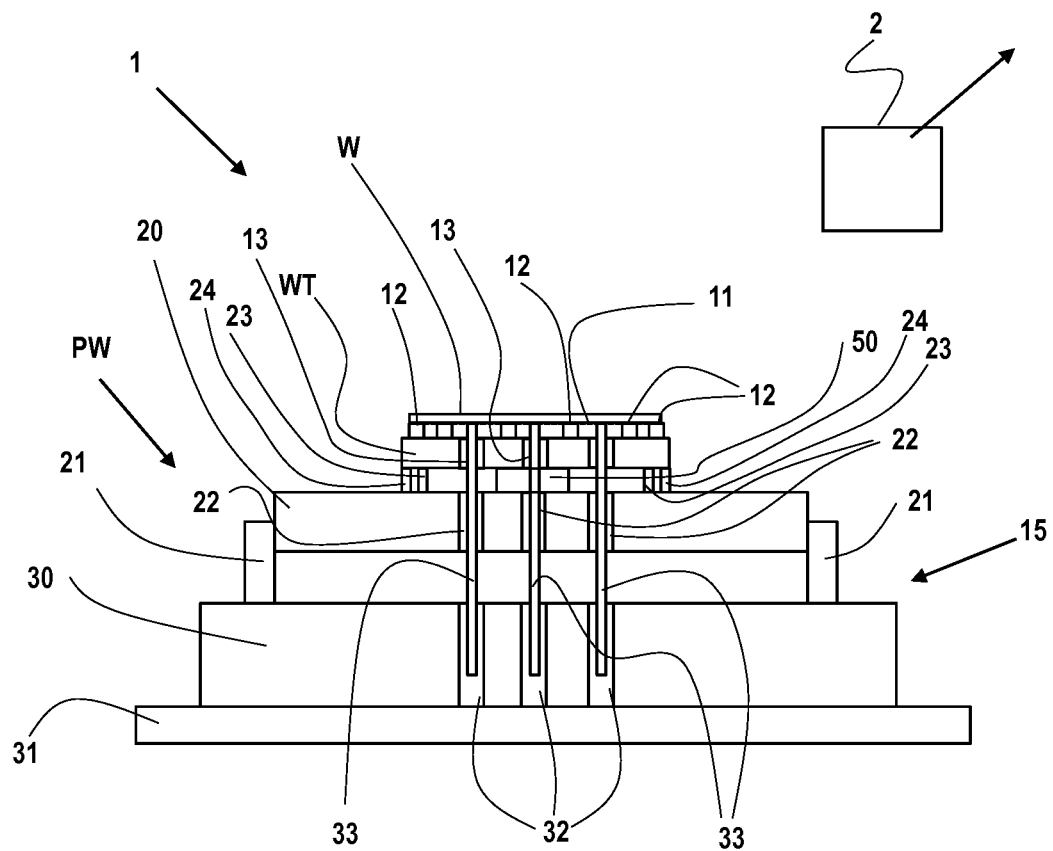

FIG. 8 shows a first embodiment of a substrate support 1 according to the invention. The substrate support 1 of FIG. 8 is of a similar construction as the substrate support as shown in FIGS. 4-7. The same reference numerals indicate the same elements of the substrate support 1.

So, in the embodiment of FIG. 8, the substrate support 1 comprises a support body WT, which support body WT comprises a support surface 11 for supporting the substrate W. The support surface 11 is formed by the top surfaces of support body burls 12.

In the embodiment of FIG. 8, the substrate support 1 further comprises a rotary dither device 50, which is configured to induce a relative rotary dither motion between the substrate W and the support surface 11 of the support body WT around a rotation axis which is perpendicular to the support surface 11, so in this example in the x-y plane around the z-axis. The rotary dither device 50 is in this embodiment arranged between the support body WT and the short-stroke module 20. Alternatively, the rotary dither device 50 is arranged at a different location, but is configured to control an actuator (which may or may not be part of the rotary dither device itself) which induces the relative rotary dither motion between the substrate W and the support surface 11 of the support body WT around a rotation axis which is perpendicular to the support surface 11.

In this embodiment, the relative rotary dither motion between the substrate W and the support surface 11 of the support body WT is obtained by supporting the substrate W on the loading pins 33 while at the same time dithering the support body WT in the x-y plane around the z-axis. The substrate W is already in contact with the top of at least one support body burl 12 when the dithering takes place. The rotary dither device 50 is configured to start inducing the relative rotary dither motion between the substrate W and the support surface 11 of the support body WT when the substrate W is in contact with at least a part of the surface of the support surface 11 of the support body WT, or before the substrate W is in contact with at least a part of the surface of the support surface 11 of the support body WT. The dithering optionally continues until or after all support body burls 12 are in full contact with the substrate W and/or until the substrate is clamped onto the support body WT. So, in this embodiment, the rotary dither device 50 is configured to induce the relative rotary dither motion between the substrate W and the support surface 11 of the support body WT when the substrate W is in contact with at least a part of the support surface 11 of the support body WT.

In this embodiment, the rotary dither device causes a rotary dither motion between the substrate (which rests on the loading pins 33) and the support body WT. The loading pins 33 are kept stationary in the x-y plane relative to the short-stroke module 20 and/or to the long-stroke module 30.

In a variant of the embodiment of FIG. 8, the support body WT is supported onto a support body holder instead of on a short-stroke module 20 of a support body positioner 15. The support body holder may be moveable or stationary. For example, the support body holder may be arranged in a lithographic apparatus or substrate inspection apparatus. For example, the support body holder may be movable or stationary relative to the base frame BF of the lithographic apparatus or substrate inspection apparatus.

In the embodiment of FIG. 8, the support body WT is supported onto the short-stroke module 20 of the support body positioner 15. In the z-direction (i.e. the vertical direction), the support body WT is optionally supported onto the short-stroke module 20 (or on the support body holder) by one or more one table support burls 23, which optionally are provided on the support body WT, e.g. on a surface of the support body WT opposite to the support surface 11, for example at the underside of the support body WT. Preferably, a plurality of table support burls 23 is provided which are spaced apart from each other. The table support burls 23 are flexible in the x-y plane so as to allow the relative rotary dither motion between the support body WT and the short-stroke module 20 (or the support body holder). Optionally, the table support burls 23 are longer in the z-direction than the support body burls 12 are. Optionally, in addition one or more support stops 24 are provided. The support stops 24 have a relatively high stiffness in the z-direction in order to provide an accurate positioning of the support body WT relative to the short-stroke module 20 (or the support body holder) in the z-direction. In this embodiment, the rotary dither device 50 comprises an actuator which is arranged in a space between the table support burls 23 and/or the support stops 24. Alternatively, the rotary dither device 50 controls an actuator which is arranged in a space between the table support burls 23 and/or the support stops 24.

Optionally, in the embodiment of FIG. 8, an additional relative dither motion between the substrate W and the support surface 11 of the support body WT is provided. The additional dither motion takes place in a direction which is different from the relative rotary dither motion around an axis which is perpendicular to the support surface 11. For example, the additional relative dither motion takes place in the z-direction (i.e. the vertical direction).

This can for example be achieved by providing a translatory dither device which is configured to dither the loading pins 33 of the substrate positioner 34 in the z-direction while the support body WT is kept stationary in the z-direction, or which is configured to dither the support body WT in the z-direction while the loading pins 33 of the substrate positioner 34 are kept stationary in the z-direction, or which is configured to dither both the support body WT and the loading pins 33 of the substrate positioner 34 in the z-direction such that a relative dither motion in the z-direction occurs. Optionally, the rotary dither device and the translatory dither device are combined into a multiple direction dither device.

Figure 9:
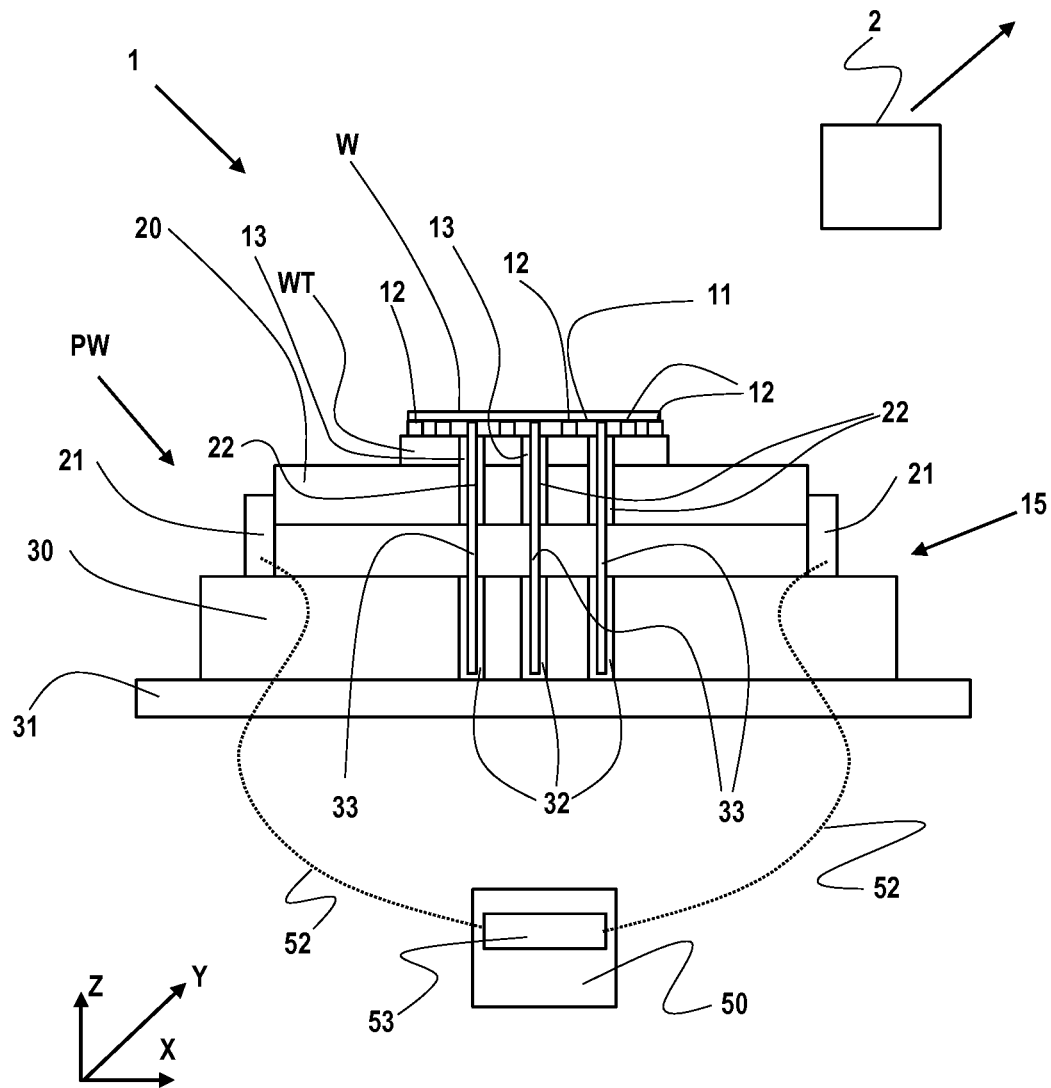

FIG. 9 shows a second embodiment of a substrate support 1 according to the invention. The substrate support 1 of FIG. 9 is of a similar construction as the substrate support as shown in FIGS. 4-7 and of the substrate support 1 as shown in FIG. 8. The same reference numerals indicate the same elements of the substrate support 1.

So, in the embodiment of FIG. 9, the substrate support 1 comprises a support body WT, which support body WT comprises a support surface 11 for supporting the substrate W. The support surface 11 is formed by the top surfaces of support body burls 12.

In the embodiment of FIG. 9, the substrate support 1 further comprises a rotary dither device 50. The rotary dither device 50 is configured to induce a relative rotary dither motion between the substrate W and the support surface 11 of the support body WT around a rotation axis which is perpendicular to the support surface 11, so in this example in the x-y plane around the z-axis.

In this embodiment, the relative rotary dither motion between the substrate W and the support surface 11 of the support body WT is obtained by supporting the substrate W on the loading pins 33 of the substrate positioner 34 while at the same time dithering the short stroke module 20 of the support body positioner 15 in the x-y plane around the z-axis. The rotary dither device causes a rotary dither motion of the short-stroke module 20 relative to the long-stroke module 30. The loading pins 33 are kept stationary in the x-y plane relative to the long-stroke module 30. The support body is supported on the short-stroke module 20 and moves along with the short-stroke module 20.

The substrate W is already in contact with the top of at least one support body burl 12 when the dithering takes place. The rotary dither device 50 is configured to start inducing the relative rotary dither motion between the substrate W and the support body burls 12, when at least a part of the substrate W is in contact with at least one support body burl 12, or before at least a part of the substrate W is in contact with at least one support body burl 12. The dithering optionally continues until or after all support body burls 12 are in contact with the substrate W and/or until the substrate is clamped onto the support body WT. So, in this embodiment, the rotary dither device 50 is configured to induce the relative rotary dither motion between the substrate W and the support surface 11 of the support body WT when the substrate W is in contact with at least a part of the support surface 11 of the support body WT.

In the embodiment of FIG. 9, the support body WT is supported onto the short-stroke module 20, e.g. in a fixed manner. The support body WT may for example be arranged in a recess in the short-stroke module 20.

In the embodiment of FIG. 9, the rotary dither device 50 is connected to the short-stroke actuators 21 of the support body positioner 15 by a control connection 52. The control connection 52 may be a wired connection or a wireless connection. The rotary dither device 50 in this embodiment comprises an actuator controller 53 which is configured to control the short-stroke actuators 21 to make the short-stroke module 20 carry out a rotary dither motion in the x-y plane around the z-direction relative to the long-stroke module 30. Alternatively, the rotary dither device 50 may be provided with an actuator which is configured to move the short-stroke module 20 relative to the long-stroke module 30.

In a variant of the embodiment of FIG. 9, the support body WT is supported onto a support body holder instead of on a short-stroke module 20. For example, the support body holder may be arranged in a lithographic apparatus or substrate inspection apparatus. For example, the support body holder may be movable relative to the base frame BF of the lithographic apparatus or substrate inspection apparatus. In this variant, the rotary dither device for example causes a rotary dither motion of the support body holder relative to the base frame BF.

Optionally, in the embodiment of FIG. 9, an additional relative dither motion between the substrate W and the support surface 12 of the support body WT is provided. The additional dither motion takes place in a direction which is different from the relative rotary dither motion around an axis which is perpendicular to the support surface 12. For example, the additional relative dither motion takes place in the z-direction (i.e. the vertical direction).

This can for example be achieved by providing a translatory dither device which is configured to dither the loading pins 33 of the substrate positioner 34 in the z-direction while the support body WT and the short-stroke module 20 of the support body positioner 15 are kept stationary in the z-direction, or which is configured to dither the support body WT and the short-stroke module 20 of the support body positioner 15 in the z-direction while the loading pins 33 of the substrate positioner 34 are kept stationary in the z-direction, or which is configured to dither both the support body WT together with the short-stroke module 20 and the loading pins 33 in the z-direction such that a relative dither motion in the z-direction occurs. Optionally, the rotary dither device and the translatory dither device are combined into a multiple direction dither device.

Figure 10:
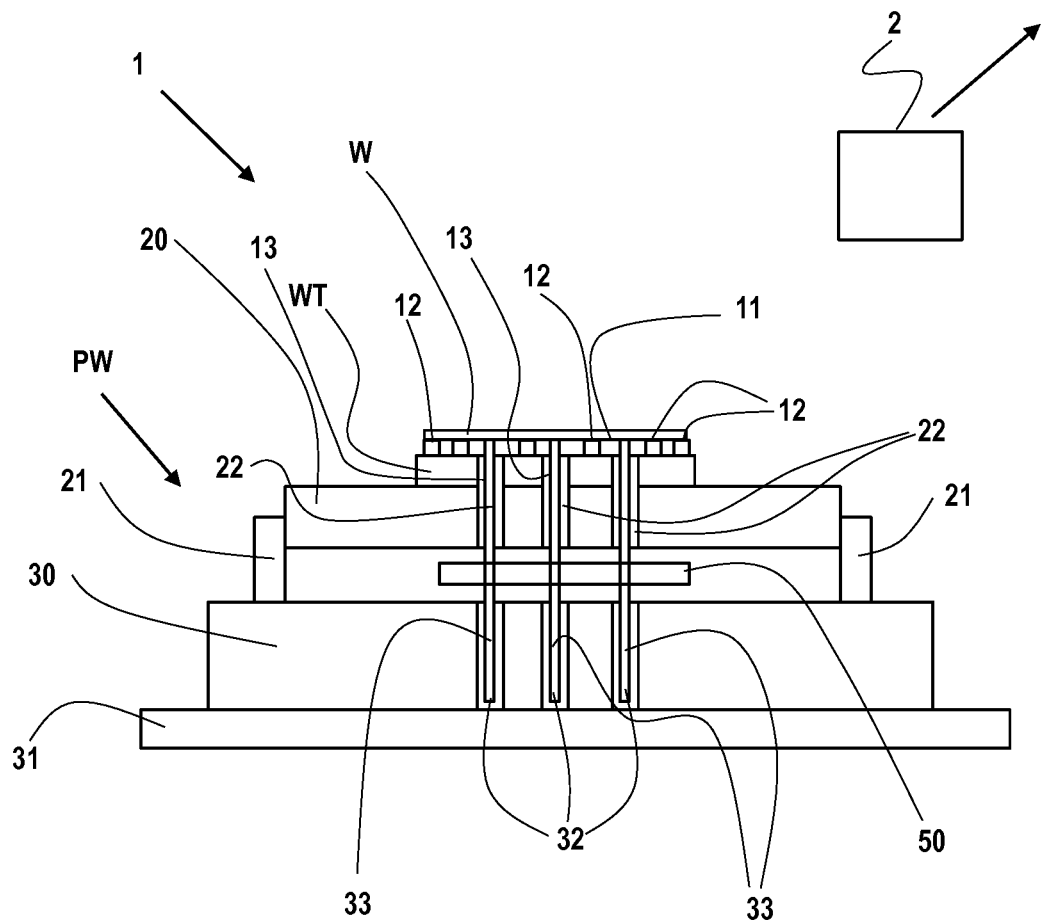
Figure 10:
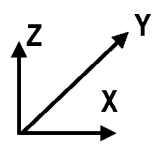

FIG. 10 shows a third embodiment of a substrate support 1 according to the invention. The substrate support 1 of FIG. 10 is of a similar construction as the substrate support as shown in FIGS. 4-7 and of the substrate supports 1 as shown in FIG. 8 and FIG. 9. The same reference numerals indicate the same elements of the substrate support 1.

So, in the embodiment of FIG. 10, the substrate support 1 comprises a support body WT, which support body WT comprises a support surface 11 for supporting the substrate W. The support surface 11 is formed by the top surfaces of support body burls 12.

In the embodiment of FIG. 10, the substrate support 1 further comprises a rotary dither device 50, which in this embodiment engages the loading pins 33 of the substrate positioner 34. The rotary dither device 50 is configured to induce a relative rotary dither motion between the substrate W and the support surface 11 of the support body WT around a rotation axis which is perpendicular to the support surface 11, so in this example in the x-y plane around the z-axis.

In this embodiment, the relative rotary dither motion between the substrate W and the support surface 11 of the support body WT is obtained by supporting the substrate W on the support surface 11 of the support body WT while at the same time dithering the loading pins 33 of the substrate positioner 34 in the x-y plane around the z-axis. The rotary dither device 50 causes a rotary dither motion of the loading pins 33 relative to the support surface 11 of the support body WT. The support surface 11 of the support body WT is kept stationary in the x-y plane.

The substrate W is already in contact with the top of at least one support body burl 12 when the dithering takes place. The rotary dither device 50 is configured to start inducing the relative rotary dither motion between the substrate W and the support body burls 12, when at least a part of the substrate W is in contact with at least one support body burl 12, or before at least a part of the substrate W is in contact with at least one support body burl 12. The dithering optionally continues until or after all support body burls 12 are in contact with the substrate W and/or until the substrate is clamped onto the support body WT. So, in this embodiment, the rotary dither device 50 is configured to induce the relative rotary dither motion between the substrate W and the support surface 11 of the support body WT when the substrate W is in contact with at least a part of the support surface 11 of the support body WT.

In a variant of the embodiment of FIG. 10, the support body WT is supported onto a support body holder instead of on a short-stroke module 20. For example, the support body holder may be arranged in a lithographic apparatus or substrate inspection apparatus. For example, the support body holder may be stationary relative to a base frame BF of the lithographic apparatus or substrate inspection apparatus. In this variant, the rotary dither device for example causes a rotary dither motion of the loading pins 33 relative to the support body holder.

In the embodiment of FIG. 10, the support body WT is supported onto the short-stroke module 20 of the support body positioner 15, e.g. in a fixed manner. The support body WT may for example be arranged in a recess in the short-stroke module 20.

In the embodiment of FIG. 10, the rotary dither device 50 is connected to the loading pins 33 of the substrate positioner 34, either directly or indirectly. The rotary dither device 50 may for example engage the loading pins 33.

In a variant of this embodiment, the rotary dither device 50 may be connected to the long-stroke module 30, which in this variant is then connected to the loading pins 33 in such a way that the loading pins 33 move along with the long-stroke module 30. The rotary dither device 50 optionally contains an actuator which imposes the rotary dither motion upon the long-stroke module 30. Alternatively, the rotary dither device is connected to the long-stroke actuator 31 by a control connection. The control connection may be a wired connection or a wireless connection. The rotary dither device is in this embodiment configured to control the long-stroke actuators 31 to make the long-stroke module 30 carry out a rotary dither motion in the x-y plane around the z-direction relative to the short-stroke module 30 and the support body WT.

Optionally, in the embodiment of FIG. 10, an additional relative dither motion between the substrate W and the support surface 12 of the support body WT is provided. The additional dither motion takes place in a direction which is different from the relative rotary dither motion around an axis which is perpendicular to the support surface 12. For example, the additional relative dither motion takes place in the z-direction (i.e. the vertical direction).

This can for example be achieved by providing a translatory dither device which is configured to dither the loading pins 33 of the substrate positioner 34 in the z-direction while the support body WT and the short-stroke module 20 of the support body positioner 14 are kept stationary in the z-direction, or which is configured to dither the support body WT and the short-stroke module 20 in the z-direction while the loading pins 33 are kept stationary in the z-direction, or which is configured to dither both the support body WT together with the short-stroke module 20 and the loading pins 33 in the z-direction such that a relative dither motion in the z-direction occurs. Optionally, the rotary dither device and the translatory dither device are combined into a multiple direction dither device.

In the embodiment of FIG. 10, the rotary dither device 50 may also be activated when the substrate gripper 2 arranges the substrate W onto the load pins 33, so before the load pins 33 arrange the substrate W onto the support surface 11 of the support body WT. This way, deformation of the substrate W due to friction between the load pins 33 and the substrate W is reduced.

The embodiments as shown in FIGS. 8, 9 and 10 may for example be applied in a lithographic apparatus or in a substrate inspection apparatus.

In an embodiment, a lithographic apparatus comprises a projection system PS and a substrate positioning system for positioning a substrate W relative to the projection system PS. In this embodiment, the substrate positioning system may comprise a substrate support 1 in accordance with one of the embodiments as shown in FIGS. 8, 9 and 10.

In an embodiment, a lithographic apparatus comprises a substrate pre-alignment device. In this embodiment, the substrate pre-alignment device may comprise a substrate support in accordance with one of the embodiments as shown in FIGS. 8, 9 and 10.

In an embodiment, a lithographic apparatus comprises a thermal stabilization device. The thermal stabilization device is configured to stabilize the temperature of the substrate W. The thermal stabilization device may be arranged to bring the substrate W to a desired temperature and/or bring the substrate W to a uniform temperature. The thermal stabilization device may comprise channels with temperature controlled fluid. The thermal stabilization device may provide a gas, such as clean air, to the substrate W, wherein the gas has a controlled temperature. In this embodiment, the thermal stabilization device may comprise a substrate support in accordance with one of the embodiments as shown in FIGS. 8, 9 and 10.

Figure 11:
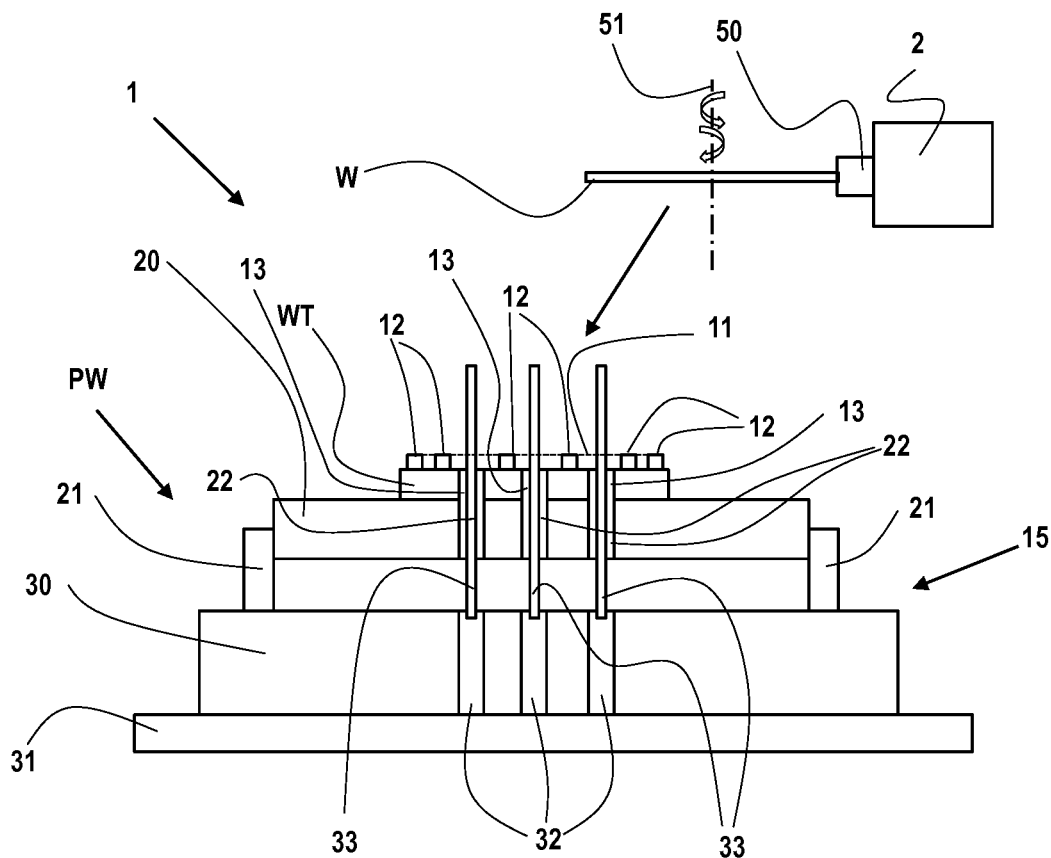

FIG. 11 shows an embodiment in which a lithographic apparatus or substrate inspection apparatus comprises a substrate gripper 2 which is configured to arrange a substrate W on a substrate support 1. For example, the substrate gripper 2 is configured to arrange a substrate W on a loading pin 33 of a substrate positioner 34 of a substrate support 1. The substrate support 1 may for example be a substrate support 1 as shown in the FIGS. 4-7, 8, 9, and 10. The substrate gripper 2 is configured to hold the substrate W in a substrate plane while arranging the substrate W on the loading pins 33 of the substrate support 1.

In this embodiment, the substrate gripper may be provided with a rotary dither device 50, which is configured to induce a relative rotary dither motion between the substrate W and the loading pins 33 around an axis 51 which is perpendicular to the substrate plane.

This way, deformation of the substrate W due to friction between the load pins 33 and the substrate W is reduced.

In an embodiment, the substrate gripper is a Bernoulli gripper arranged to handle the substrate W in a non-contact manner. By applying a gas flow along the substrate W, the Bernoulli gripper can hold the substrate W via a fast flowing gas film which causes a reduced pressure between the gripper and the substrate W. This reduced pressure makes that the substrate is biased towards the gripper, but at the same time the gas film prevent mechanical contact between the substrate W and the gripper. The gas film prevents mechanical contact between the substrate W and the substrate gripper. The Bernoulli gripper may hold the upper side of the substrate W, i.e., the side of the substrate W on which the patterns are imaged. By holding the upper side, the Bernoulli gripper may place the substrate W onto the support surface 11 without the need of using the loading pins 33. In this embodiment, the rotary dither device 50 is configured to induce a relative rotary dither motion between the substrate W and the support surface 11 around an axis 51 which is perpendicular to the substrate plane, when the substrate W is held by the substrate gripper.

Figure 12:
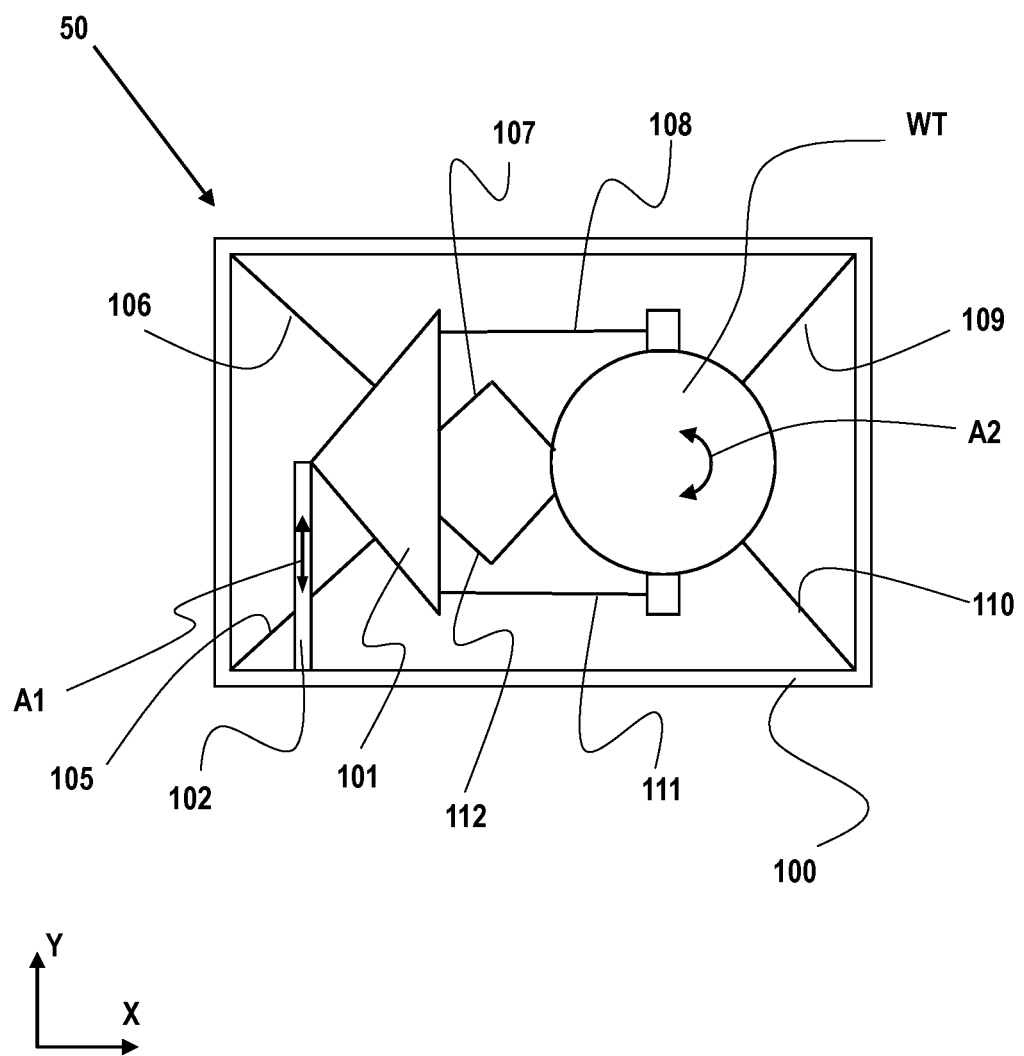
FIG. 12 shows an embodiment of a rotary dither device.

FIG. 12 shows an embodiment of a rotary dither device 50.

In this embodiment, a frame 100 is provided to which several elements of the dither device can be connected. However, when the dither device 50 is used in for example a lithographic apparatus or a substrate inspection apparatus, the frame 100 may be dispensed with. Instead, the respective elements of the dither device 50 may be connected to elements of the lithographic apparatus or the substrate inspection apparatus, respectively.

In the embodiment of FIG. 12, the dither device 50 comprises a dither device actuator 102. In this embodiment, this is a linear actuator, for example a piezo actuator or a Lorentz actuator. The linear actuator 102 in this embodiment is arranged to operate in the x-y plane, which is parallel to the plane in which the support surface 11 extends.

In the embodiment of FIG. 12, the dither device actuator 102 is coupled to a motion transfer body 101, which in this case has a triangular shape. The motion transfer body 101 is connected to the frame by two straight leaf springs 105, 106. Furthermore, the motion transfer body 101 is coupled to the object to be dithered by two straight leaf springs 108, 111 and by two bent leaf springs 107, 112. In the embodiment of FIG. 12, the object to be dithered is the support body WT. In variants of the embodiment of FIG. 12, the object to be dithered may be different. For example, the object to be dithered may be a short-stroke module 20, or loading pins 33.

The object to be dithered is connected to the frame 100 by straight leaf springs 109, 110.

The configuration of the leaf springs 105, 106, 107, 108, 109, 110, 111, 112 is such that the linear motion of the dither device actuator 102 in the x-y plane is transformed into a rotary motion in the x-y plane. This is for example achieved with the configuration of the leaf springs 105, 106, 107, 108, 109, 110, 111, 112 as shown in FIG. 12.

In any of the embodiments described above, the relative rotary dither motion has for example an amplitude in the range of 0.01 micrometers to 10 micrometers (end points included in the range), optionally an amplitude in the range of 0.05 micrometers to 5 micrometers (end points included in the range), e.g. an amplitude in the range of 0.1 micrometers to 2 micrometers (end points included in the range), e.g. an amplitude in the range of 0.5 micrometers to 1.5 micrometers (end points included in the range).

In any of the embodiments described above, an optional additive relative dither motion for example has an amplitude in the range of 0.01 micrometers to 10 micrometers (end points included in the range), optionally an amplitude in the range of 0.05 micrometers to 5 micrometers (end points included in the range), e.g. an amplitude in the range of 0.1 micrometers to 2 micrometers (end points included in the range), e.g. an amplitude in the range of 0.5 micrometers to 1.5 micrometers (end points included in the range).

In any of the embodiments described above, the relative rotary dither motion for example has a dithering frequency in the range of 100 Hz to 10 kHz (end points included in the range), optionally a dithering frequency in the range of 200 Hz to 5 kHz (end points included in the range), e.g. a dithering frequency in the range of 500 Hz to 1.5 kHz (end points included in the range).

In any of the embodiments described above, an optional additive dither motion for example has a dithering frequency in the range of 100 Hz to 10 kHz (end points included in the range), optionally a dithering frequency in the range of 200 Hz to 5 kHz (end points included in the range), e.g. a dithering frequency in the range of 500 Hz to 1.5 kHz (end points included in the range).

The dither motion may have a velocity profile in the form of a sinusoidal shape, or a combination of sinusoidal shapes. Alternatively or in addition, the dither motion may have velocity profile having a step-shape, a triangular shape or a trapezium shape.

In case the dither device 50 is configured to control an actuator that is already available in the substrate support, lithographic device or substrate inspection apparatus, e.g. an actuator of a short-stroke module 20 or an actuator of a long-stroke module 30, open loop control signals may be used to induce the dither motion. These open loop control signals may be applied in addition to the control signals that are used for controlling any other motions that are effected by the respective actuator.

The inspection apparatus mentioned above may be any type of apparatus that is arranged to measure a property of the substrate W. For example, the inspection apparatus may have a mark detection system arranged to determine a position of a mark on the substrate W. The inspection apparatus may measure a relative position between two marks in the same layer or between two marks on different layers.

The inspection apparatus may be integrated with a lithographic apparatus. For example, the substrate W is first loaded on the substrate support 1 arranged near the mark detection system of the inspection apparatus. After the inspection apparatus has completed the inspection, the substrate W is unloaded from the substrate support 1 arranged near the mark detection system and is loaded onto the substrate support 1 arranged near the projection system PS of the lithographic apparatus. Multiple rotary dither devices may be provided; a rotary dither device 50 for the substrate support 1 arranged near the mark detection system and a rotary dither device 50 for the substrate support 1 arranged near the projection system P.

The inspection apparatus may comprise an e-beam (electron-beam) device arranged to propagate an e-beam onto the substrate W to determine the shape and/or position of at least a part of a pattern imaged on the substrate W.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A substrate support for supporting a substrate, comprising:
    a support body comprising a support surface configured to support the substrate;
    a short stroke module;
    a long-stroke module; and
    a rotary dither device,
    wherein the short-stroke module is arranged to move the support body relative to the long-stroke module,
    wherein the long-stroke module is arranged to move the short-stroke module, and
    wherein the rotary dither device is configured to induce a relative rotary dither motion between the substrate and the support surface of the support body around a rotation axis that is perpendicular to the support surface.

2. The substrate support of claim 1, wherein the rotary dither device is configured to induce the relative rotary dither motion between the substrate and the support surface of the support body when the substrate is in contact with at least a part of the support surface of the support body.

3. The substrate support of claim 1, wherein:
    the support body comprises a plurality of support body burls, and
    the top surfaces of the support body burls together form the support surface.

4. The substrate support of claim 1, wherein the rotary dither device is configured to induce a relative rotary dither motion between the substrate and a combination of the support body and short-stroke module.

5. The substrate support of claim 1, wherein:
    the substrate body comprises a plurality of table support burls that are configured to support the substrate body on the short-stroke module, which table support burls are spaced apart from each other, and
    the rotary dither device comprises an actuator that is arranged in a space between adjacent table support burls.

6. The substrate support of claim 1, wherein the rotary dither device is configured to induce a relative rotary dither motion between the short-stroke module and long-stroke module.

7. The substrate support of claim 1, wherein:
    the substrate support further comprises a substrate positioner configured to arrange the substrate on the support surface of the support body, and the rotary dither device is configured to induce a relative rotary dither motion between the substrate held by the substrate positioner and the substrate support surface.

8. The substrate support of claim 7, wherein:
the substrate positioner comprises loading pins,
the rotary dither device is connected to the loading pins, and
the long-stroke module is connected to the loading pins in such a way that the loading pins move along with the long-stroke module.

9. The substrate support of claim 1, wherein:
the substrate positioner is configured to hold the substrate in a substrate plane while arranging the substrate on the support surface of the support body, and
the rotary dither device is configured to provide an additional relative dither motion in a direction different from the relative rotary dither motion.

10. A lithographic apparatus, comprising:
a substrate support for supporting a substrate comprising:
a support body comprising a support surface configured to support the substrate;
a short stroke module;
a long-stroke module; and
a rotary dither device,
wherein the short-stroke module is arranged to move the support body relative to the long-stroke module,
wherein the long-stroke module is arranged to move the short-stroke module, and
wherein the rotary dither device is configured to induce a relative rotary dither motion between the substrate and the support surface of the support body around a rotation axis that is perpendicular to the support surface.

11. A lithographic apparatus, comprising:
a projection system; and
a substrate positioning system configured to position a substrate relative to the projection system, the substrate positioning system comprising a substrate support for supporting the substrate, the substrate support comprising:
a support body comprising a support surface configured to support the substrate;
a short stroke module;
a long-stroke module; and
a rotary dither device,
wherein the short-stroke module is arranged to move the support body relative to the long-stroke module,
wherein the long-stroke module is arranged to move the short-stroke module, and
wherein the rotary dither device is configured to induce a relative rotary dither motion between the substrate and the support surface of the support body around a rotation axis that is perpendicular to the support surface.

12. A lithographic apparatus, comprising:
a substrate pre-alignment device comprising a substrate support for supporting a substrate, the substrate support comprising:
a support body comprising a support surface configured to support the substrate;
a short stroke module;
a long-stroke module; and
a rotary dither device,
wherein the short-stroke module is arranged to move the support body relative to the long-stroke module,
wherein the long-stroke module is arranged to move the short-stroke module, and
wherein the rotary dither device is configured to induce a relative rotary dither motion between the substrate and the support surface of the support body around a rotation axis that is perpendicular to the support surface.

13. A lithographic apparatus, comprising:
a substrate thermal stabilization device configured to stabilize a temperature of a substrate, the substrate thermal stabilization device comprising a substrate support for supporting the substrate, the substrate support comprising:
a support body comprising a support surface configured to support the substrate;
a short stroke module;
a long-stroke module; and
a rotary dither device,
wherein the short-stroke module is arranged to move the support body relative to the long-stroke module,
wherein the long-stroke module is arranged to move the short-stroke module, and
wherein the rotary dither device is configured to induce a relative rotary dither motion between the substrate and the support surface of the support body around a rotation axis that is perpendicular to the support surface.

14. A substrate inspection apparatus, comprising:
a substrate support for supporting a substrate, comprising:
a support body comprising a support surface configured to support the substrate;
a short stroke module;
a long-stroke module; and
a rotary dither device,
wherein the short-stroke module is arranged to move the support body relative to the long-stroke module,
wherein the long-stroke is arranged to move the short-stroke module, and
wherein the rotary dither device is configured to induce a relative rotary dither motion between the substrate and the support surface of the support body around a rotation axis that is perpendicular to the support surface.

15. A device manufacturing method comprising:
transferring a pattern from a patterning device onto a substrate; and
using a lithographic apparatus comprising a substrate support for supporting the substrate, wherein the using comprises using the substrate support comprising:
a support body comprising a support surface configured to support the substrate;
a short stroke module;
a long-stroke module; and
a rotary dither device,
wherein the short-stroke module is arranged to move the support body relative to the long-stroke module,
wherein the long-stroke module is arranged to move the short-stroke module, and
wherein the rotary dither device is configured to induce a relative rotary dither motion between the substrate and the support surface of the support body around a rotation axis that is perpendicular to the support surface.

* * * * *